(12) United States Patent
Trimberger

(10) Patent No.: US 6,963,510 B1
(45) Date of Patent: Nov. 8, 2005

(54) PROGRAMMABLE CAPACITOR AND METHOD OF OPERATING SAME

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 82 days.

(21) Appl. No.: 10/669,588

(22) Filed: Sep. 23, 2003

Related U.S. Application Data

(62) Division of application No. 09/805,553, filed on Mar. 12, 2001, now Pat. No. 6,653,673, which is a continuation of application No. 09/113,612, filed on Jul. 10, 1998, now Pat. No. 6,255,675.

(51) Int. Cl.$^7$ .............................................. G11C 16/04
(52) U.S. Cl. ................................... 365/189.09; 365/63
(58) Field of Search ........................... 365/189.09, 63, 365/51, 52, 149

(56) References Cited

U.S. PATENT DOCUMENTS

| | | |
|---|---|---|
| 4,035,629 A | 7/1977 | Lampe et al. |
| 4,195,282 A | 3/1980 | Cameron |
| 4,937,649 A | 6/1990 | Shiba et al. |
| 5,148,263 A | 9/1992 | Hamai |
| 5,309,015 A | 5/1994 | Kuwata et al. |
| 5,401,988 A | 3/1995 | Kudou et al. |
| 5,644,262 A | 7/1997 | Bazes |
| 5,754,380 A | 5/1998 | Ker et al. |
| 5,917,230 A | 6/1999 | Aldrich |
| 6,066,553 A * | 5/2000 | Sandhu et al. .............. 438/624 |
| 6,180,494 B1 * | 1/2001 | Manning .................... 438/443 |
| 6,211,054 B1 * | 4/2001 | Li et al. ..................... 438/618 |
| 6,211,714 B1 | 4/2001 | Jeong |
| 6,255,675 B1 | 7/2001 | Trimberger |

OTHER PUBLICATIONS

Milton Gussow, "Basic Electricity: Capacitance, Capacitive Reactance, and Capacitive Circuits", Chapter 13, pp 251–253.
Paul Horowitz, "The Art of Electronics" Cambridge Univ. Press, 2nd Edition, 1989.

* cited by examiner

Primary Examiner—Anh Phung
(74) Attorney, Agent, or Firm—Bever Hoffman & Harms; Edel M. Young

(57) ABSTRACT

A programmable capacitor in an integrated circuit (IC) comprises a conductive line located parallel to an interconnect. When a bias voltage is applied to the conductive line, a parasitic capacitance is created between the interconnect and the conductive line. By properly sizing and locating the conductive line, a desired capacitance can be coupled to the interconnect. A bias control circuit can apply or remove the bias voltage from the conductive line, thereby enabling the capacitance to be coupled or decoupled, respectively, from the interconnect. Because of its simple construction, multiple capacitive structures can be formed around a single interconnect to provide capacitive adjustment capability. By changing the number of conductive lines to which the bias voltage is applied, the total capacitance provided by the multiple capacitive structures can be varied. A feedback loop can be incorporated to provide adjustment during IC operation.

3 Claims, 7 Drawing Sheets

PROGRAMMABLE CAPACITOR AND METHOD OF OPERATING SAME

FIELD OF THE INVENTION

The present invention relates to capacitive devices, and more particularly, to a programmable capacitor in an integrated circuit.

BACKGROUND OF THE INVENTION

In integrated circuits (IC's), capacitors are commonly used for data storage, signal filtering, and timing adjustments. However, conventional IC capacitors are difficult and/or costly to produce within an IC due to the nature of current wafer processing techniques. FIG. 1A shows a conventional planar capacitor 101, which comprises a polysilicon layer 130 and an oxide layer 140 formed on a p-type substrate 110. Polysilicon layer 130 and a depletion region 112 in substrate 110 provide an upper plate and a lower plate, respectively, for planar capacitor 101. The dielectric constant of oxide layer 140, along with the area of polysilicon layer 130 and the area of depletion region 112 control the capacitance of capacitor 101. The simple geometry of planar capacitor 101 is relatively straightforward to manufacture. However, the planar construction of planar capacitor 101 requires that polysilicon layer 130 occupy a large area on the surface of an IC die. This large area makes the construction of planar capacitor 101 increasingly problematic as IC die sizes decrease and device densities increase.

FIG. 1B shows a conventional trench capacitor 102, comprising a polysilicon layer 132 having a plate portion 133, and an oxide layer 142 extending into a trench 114 formed in a substrate 110. Oxide layer 142 provides a dielectric layer between plate portion 133 and a depletion region 113 formed in substrate 110 around trench 114. By orienting the capacitor "plates" in the vertical direction, trench capacitor 102 occupies significantly less IC die surface area than planar capacitor 101. However, the irregular geometry of trench capacitor 102 significantly increases manufacturing complexity, thereby leading to increased cost and decreased reliability.

FIG. 1C shows a conventional stacked capacitor 103, comprising an oxide layer 144 sandwiched by an upper polysilicon layer 134 and an intermediate polysilicon layer 150. Stacked capacitor 103 is formed over an NMOS transistor 160. NMOS transistor 160 is not an essential component of stacked capacitor 103, and can be replaced with other IC structures, such as bipolar transistors or resistive elements. NMOS transistor 160 comprises a polysilicon gate 162 and a gate oxide 164 formed over two n-type regions 120 in substrate 110. An oxide layer 166 provides a surface insulating layer for NMOS transistor 160. Intermediate polysilicon layer 150 is deposited over one of the n-type regions 120 of NMOS transistor 160 and a portion of oxide layer 166. Intermediate polysilicon layer 150 also extends over a field oxide 124 that isolates NMOS transistor 160 from adjacent IC devices. Oxide layer 144 is formed over intermediate polysilicon layer 150, and upper polysilicon layer 134 is deposited over oxide layer 144 to complete stacked capacitor 103. The non-planar contours of upper polysilicon layer 134 and intermediate polysilicon layer 150 increase their effective surface areas, thereby increasing the capacitance of stacked capacitor 103. Because stacked capacitor 103 is "stacked" over an existing IC structure, efficient IC die surface area utilization is provided. At the same time, the deep etch and subsequent step coverage issues of trench capacitor 102 are avoided. However, while stacked capacitor 103 is easier to produce than trench capacitor 102, the formation of intermediate polysilicon layer 150 requires an additional polysilicon deposition step, thereby increasing overall manufacturing cost and cycle time for an IC including stacked capacitor 103.

Due to variations inherent in semiconductor manufacturing processes, specific capacitance values are difficult to produce using the aforementioned conventional capacitance structures. The dielectric constant of an oxide layer can vary between production runs, and precise control of oxide layer thickness is difficult to achieve. Also, the non-planar configurations of the trench and stacked capacitors makes the areas of the polysilicon "plates" difficult to accurately control. Finally, during normal IC operation, temperature effects can change the material properties of the capacitive structures, leading to further variations in actual capacitance values. Therefore, conventional capacitive structures are ill-suited for situations requiring precise capacitance settings, such as delay lines and bandpass filters.

Accordingly, it is desirable to provide a capacitive structure in an IC that is compact, easily manufacturable, controllable, and adaptable to process and operating variations.

SUMMARY OF THE INVENTION

The present invention is directed towards apparatus and methods for creating capacitance in an integrated circuit (IC), overcoming the cost and accuracy limitations of conventional capacitive structures by utilizing controlled parasitic capacitance effects.

Typically, IC manufacturers attempt to eliminate parasitic (unwanted) capacitances in IC's. An IC comprises a variety of functional devices configured to perform specified sets of tasks. Dielectric material separates and isolates the functional devices from one another. Interconnects provide conductive paths between functional devices, thereby allowing signals to be transmitted from one functional device to another. When interconnects run parallel to one another, parasitic capacitances can be generated which impose undesirable effects on the signals travelling along the interconnects. Maintaining a large spacing between interconnects alleviates the problem, but the industry trend towards shrinking IC die sizes and increasing device densities makes such a technique unfeasible. Alternative methods such as multilevel, orthogonal placement of interconnects can reduce the effects of parasitic capacitances, but also increase manufacturing cost and complexity.

In an embodiment of the present invention, a conductive line is coupled to a bias control circuit. The conductive line is positioned parallel to an interconnect that electrically connects two IC devices within an integrated circuit. The bias control circuit applies a bias voltage to the parallel conductive line to induce a parasitic capacitance between the interconnect and the parallel conductive line. By making the parasitic capacitance equal to a desired capacitance, signals transmitted between the two IC devices along the interconnect can be delayed or filtered. The magnitude of the parasitic capacitance is controlled by the length of the parallel conductive line, the distance between the interconnect and the parallel conductive line, and the dielectric constant of the material between the interconnect and the parallel conductive line. Unlike an interconnect, which provides a conductive path between two or more IC devices, the parallel conductive line has no specific routing requirements, and can therefore be sized as necessary to provide the desired capacitance.

In another embodiment of the present invention, the bias control circuit comprises logic circuits to selectively bias the parallel conductive line to a desired voltage potential. Removal of the bias voltage from the parallel conductive line minimizes the capacitive path between the interconnect and the conductive line, thereby allowing the parasitic capacitance to be decoupled from the interconnect as desired.

In another embodiment of the present invention, multiple parallel conductive lines are placed along side the interconnect. By changing the number of the multiple parallel conductive lines to which the bias voltage is applied, the total capacitance coupled to the interconnect can be adjusted.

The present invention will be more fully understood in view of the following description and drawings.

DETAILED DESCRIPTION OF THE DRAWINGS

Figure 1A:
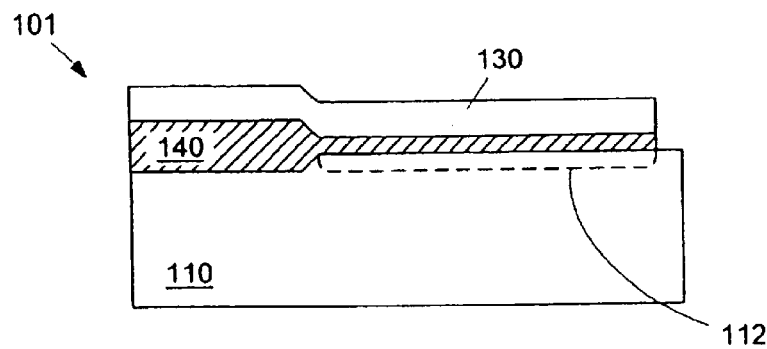
FIGS. 1A–1C are cross-sectional diagrams of conventional IC capacitive structures.
Figure 1B:
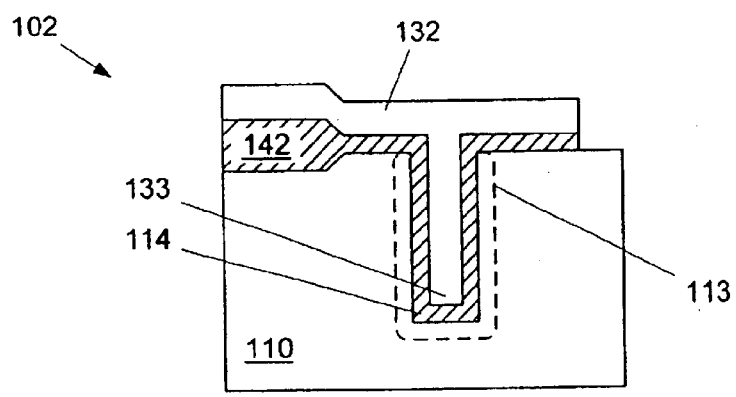
Figure 1C:
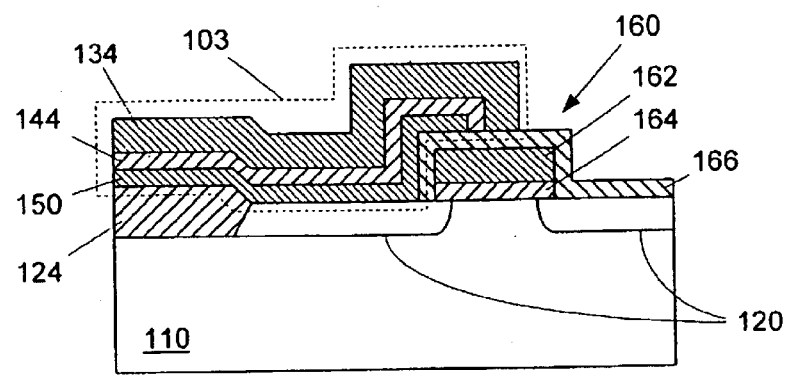
Figure 2A:
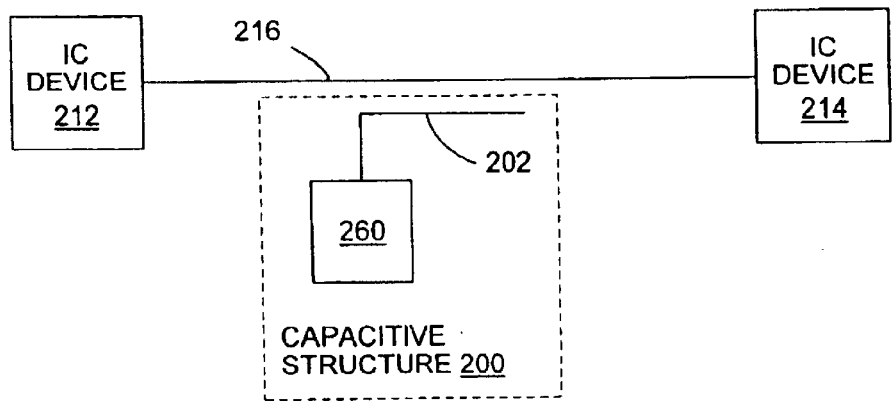
FIGS. 2A and 2B are circuit diagrams of capacitive structures in accordance with the present invention.

FIG. 2A shows a circuit comprising a capacitive structure 200 in accordance with an embodiment of the present invention. Capacitive structure 200 comprises a conductive line 202 coupled to a bias control circuit 260. Conductive line 202 is positioned parallel to an interconnect 216 that electrically couples a first integrated circuit (IC) device 212 and a second IC device 214 in a single integrated circuit. Bias control circuit 260 comprises circuitry to apply a bias voltage to conductive line 202. When conductive line 202 is properly biased by bias control circuit 260, a capacitance is coupled between conductive line 202 and interconnect 216. Interconnect 216 typically comprises a metal or polysilicon line, and first IC device 212 and second IC device 214 can comprise various structures formed in an IC, such as transistors, inverters, or even configurable logic blocks (CLB's) of a programmable logic device (PLD) such as a field programmable gate array (FPGA). Conductive line 202 can be formed along side interconnect 216 using the same process steps used to create interconnect 216, thereby eliminating the need for the additional manufacturing process steps typically required by conventional capacitive structures. However, conductive line 202 can also be formed over or under interconnect 216, while still providing the desired capacitive function.

Figure 2B:
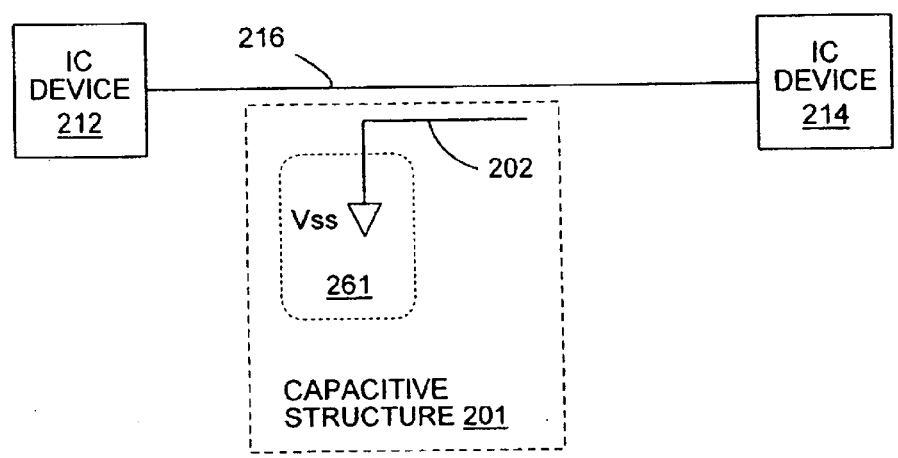

FIG. 2B shows a capacitive structure 201 in accordance with a particular embodiment of the present invention. Capacitive structure 201 comprises a bias control circuit 261 coupled to a conductive line 202. Bias control circuit 261 provides a conductive path between conductive line 202 and the Vss voltage supply terminal. In the described embodiment, the Vss voltage supply terminal is maintained at a voltage of 0V (ground). Because conductive line 202 is electrically connected to ground, a capacitive path is provided between interconnect 216 and ground.

Figure 2C:
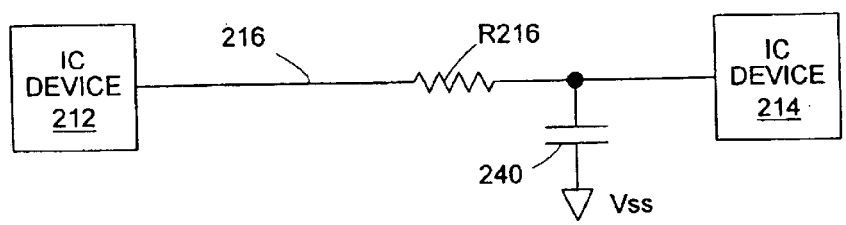
FIG. 2C is a circuit diagram of an equivalent circuit to a capacitive structure in accordance with the present invention.

FIG. 2C shows a circuit electrically equivalent to the circuit of FIG. 2B. A resistance R216 represents the line resistance of interconnect 216, and a capacitor 240 represents a capacitance C240 provided by capacitive structure 201. Resistance R216 is coupled between first IC device 212 and second IC device 214, while capacitor 240 is coupled between interconnect 216 and the Vss voltage supply terminal, thereby forming an RC circuit between first IC device 212 and second IC device 214. As is well known in the art, the charging and discharging time constant of a capacitor in an RC circuit is directly related to the resistance of the resistor and the capacitance of the capacitor. For the circuit shown in FIG. 2C, if an output signal from IC device 212 is a step function between ground (0V) and a maximum voltage Vmax, an input signal received by IC device 214 is the same as a voltage Vc across capacitor 240. When capacitor 240 is being charged (the output signal from IC device 212 switching from 0V to voltage Vmax), a voltage Vc across capacitor 240 varies according to the equation:

$$Vc = Vmax(1 - e^{-t/(R216C \cdot C240)}) \qquad (1)$$

Similarly, when capacitor 240 is being discharged (the output signal from IC device 212 switching from voltage Vmax to 0V), voltage Vc varies according to the equation:

$$Vc = Vmax * e^{-t/(R216 \cdot C240)} \qquad (2)$$

In either the charging or discharging case, the change in voltage Vc is proportional to the exponential term $e^{-t/(R216 \cdot C240)}$. Therefore, the coupling of capacitor 240 to interconnect 216 creates an effective delay element between first IC device 212 and second IC device 214. As can be seen from equations (1) and (2), the rate of change of voltage Vc is dependent on the value of capacitance C240. Therefore, by properly configuring conductive line 202 (FIG. 2B), a desired delay can be applied to signals travelling between first IC device 212 and second IC device 214.

Figure 2D:
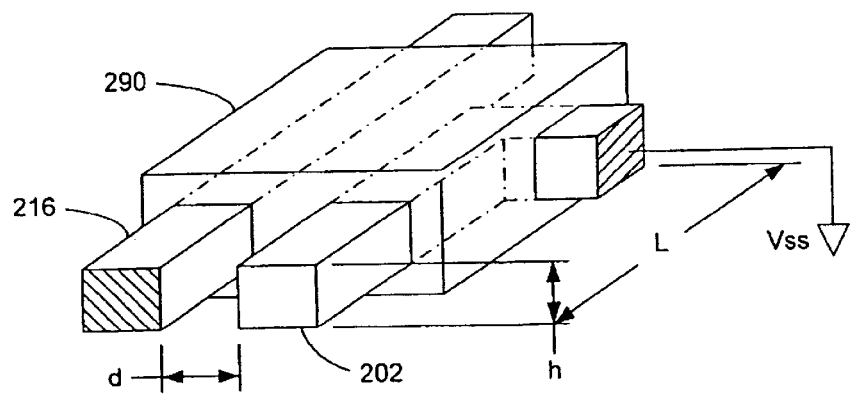
FIG. 2D is an isometric diagram depicting factors affecting the capacitance value of a capacitive structure in accordance with the present invention.

FIG. 2D shows an isometric representation of interconnect 216 and conductive line 202 isolated from one another by a dielectric material 290. Conductive line 202 has a length L and a height h. Interconnect 216 and conductive line 202 are parallel and separated by a distance d. Capacitance $C_{240}$ formed between interconnect 216 and conductive line 202 is then defined by the equation:

$$C240((8.85 \times 10^{-12} F/mm) * k * L * h)/d \qquad (3)$$

where k is the dielectric constant of dielectric material 290 and all lengths are in units of meters. Dielectric material 290 is typically silicon dioxide, which can have a dielectric constant from 5 to 25, depending on the oxide manufacturing process. Other materials such as silicon nitride and various polyimides can also be used as dielectrics.

Figure 3A:
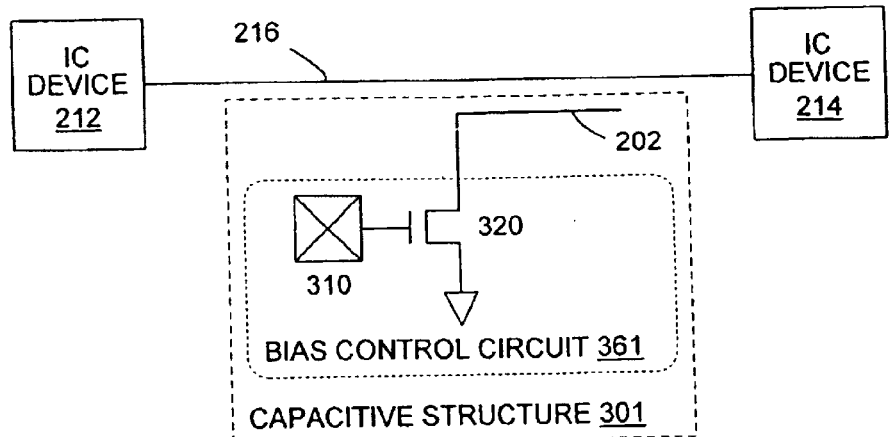
FIGS. 3A–3C are circuit diagrams of capacitive structures in accordance with the present invention.

FIG. 3A shows a capacitive structure 301 including a bias control circuit 361 coupled to a conductive line 202, in accordance with another embodiment of the present invention. Bias control circuit 361 comprises a memory cell 310 coupled to the gate terminal of a pass transistor 320. A first signal terminal of pass transistor 320 is coupled to conductive line 202, and a second signal terminal of pass transistor 320 is coupled to the Vss voltage supply terminal. When the output of memory cell 310 is in a logic HIGH state, pass transistor 320 is turned on, thereby coupling conductive line 202 to the Vss voltage supply terminal and enabling the capacitive function of capacitive structure 301. However, when the output of memory cell 310 is in a logic LOW state, pass transistor 320 is turned off. As a result, conductive line 202 is not connected to any voltage potential, or is left "floating". Because line 202 is left in a floating state, it is not connected into the equivalent circuit of FIG. 2C. As a result, the capacitor has little to no effect on signals transmitted on interconnect 216. In this manner, capacitive structure 301 provides an "on/off switchable" capacitance that can be activated or de-activated as desired.

Figure 3B:
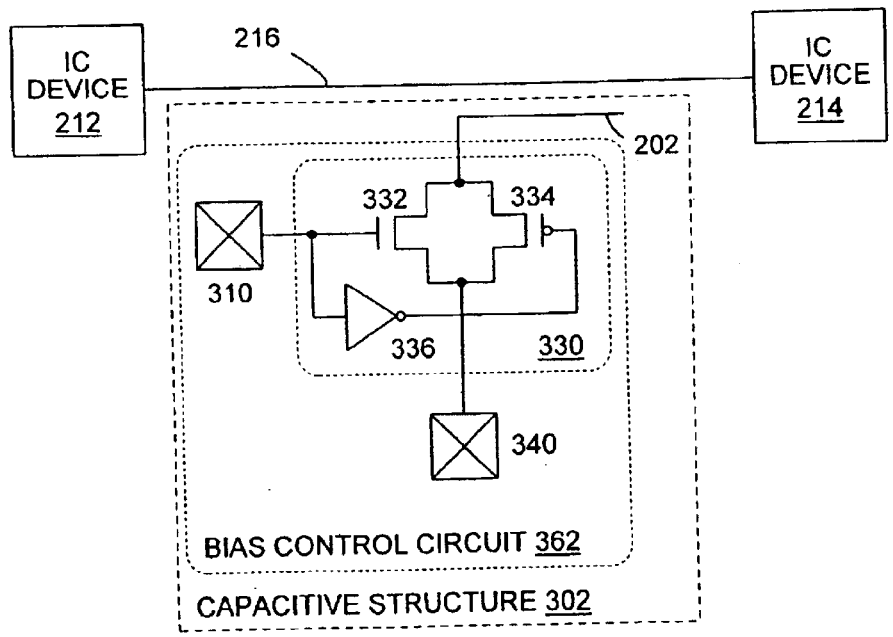

FIG. 3B shows another embodiment of the present invention, a capacitive structure 302 that comprises a bias control circuit 362 coupled to conductive line 202. Bias control circuit 362 comprises a transmission gate 330, and memory cells 310 and 340. Transmission gate 330 is formed by an NMOS pass transistor 332, a PMOS pass transistor 334, and an inverter 336. A first signal terminal of NMOS pass transistor 332 is coupled to a first signal terminal of PMOS pass transistor 334 to form an output terminal of transmission gate 330. A second signal terminal of NMOS pass transistor 332 is coupled to a second signal terminal of PMOS pass transistor 334 to form an input terminal of transmission gate 330. A gate terminal of NMOS pass transistor 332 is coupled to an input terminal of inverter 336 to form a control terminal of transmission gate 330. Finally, an output terminal of inverter 336 is connected to a gate terminal of PMOS pass transistor 334 to complete transmission gate 330. The output terminal of transmission gate 330 is coupled to conductive line 202. An output signal from memory cell 310 is applied to the control terminal of transmission gate 330, whereas an output signal from memory cell 340 is applied to the input terminal of transmission gate 330. When the output signal of memory cell 310 is in a logic HIGH state, both NMOS pass transistor 332 and PMOS pass transistor 334 are turned on, allowing the output signal of memory cell 340 to bias conductive line 202. Because memory cell 340 can provide either a logic HIGH or logic LOW output signal, line 202 can be biased to either state, depending on the desired effect of capacitive structure 302. Memory cell 340 ca be replaced with an adjustable voltage generator to provide even greater bias resolution. In addition, when the output signal of memory cell 310 switches to a logic LOW state, transmission gate 330 is turned off. This switching in turn biases conductive line 202 to a floating state which decouples conductive line 202 from interconnect 216, thereby effectively eliminating the capacitive effect of capacitive structure 302. Alternatively, separate memory cells could be used to control NMOS pass transistor 332 and PMOS pass transistor 334.

Figure 3C:
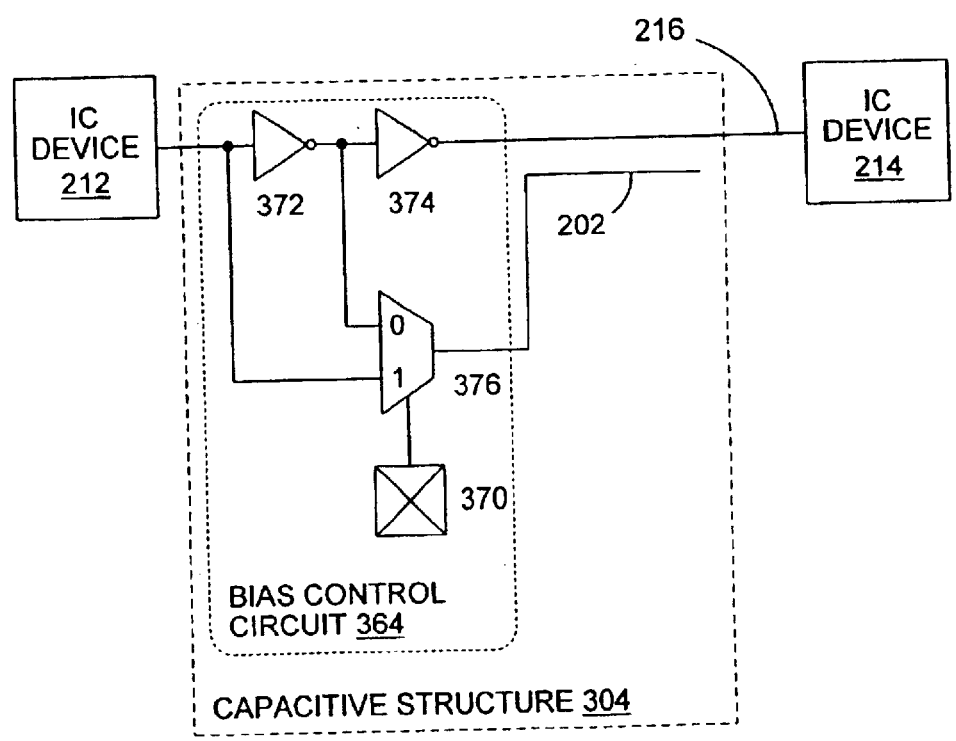

FIG. 3C shows a capacitive structure 304 according to another embodiment of the present invention. Capacitive structure 304 comprises a bias control circuit 364 coupled to a conductive line 202. Bias control circuit 364 comprises a memory cell 370, a first inverter 372, a second inverter 374, and a multiplexer 376. An output terminal of IC device 212 is connected to an input terminal of first inverter 372 and a first input terminal of multiplexer 376. An output terminal of first inverter 372 is connected to an input terminal of second inverter 374 and a second input terminal of multiplexer 376. An output terminal of second inverter 374 is connected to interconnect 216. An output terminal of multiplexer 376 is coupled to conductive line 202 which is positioned parallel to interconnect 216. Finally, memory cell 370 is coupled to a control terminal of multiplexer 376. Memory cell 370 controls the output signal provided by the output terminal of multiplexer 376.

When an output signal from the output terminal of IC device 212 is generated, the transmission delays associated with first inverter 372 and second inverter 374 allow the output of multiplexer 376 to adjust the voltage on conductive line 202 before an output signal from the output terminal of second inverter 374 can be applied to interconnect 216. By defining the signal passed by multiplexer 376, memory cell 370 controls the capacitive effect provided by conductive line 202.

If the output of memory cell 370 is a logic "0" (LOW), multiplexer 376 couples conductive line 202 with the output of first inverter 372. As a result, a capacitive delay is applied to signals on interconnect 216 due to the capacitive coupling of conductive line 202. For example, if the output of IC device 212 is in a logic LOW state for an initial period of time, interconnect 216 will also be in a LOW state, while conductive line 202 will be HIGH. When the output of IC device 212 switches from LOW to HIGH, the output of first inverter 372 goes LOW, bringing conductive line 202 to a logic LOW state also. Due to the delay introduced by second inverter 374, interconnect 216 does not begin to transition until after conductive line 202 has switched from HIGH to LOW. Consequently, the transition of interconnect 216 from LOW to HIGH is delayed by the capacitive coupling of conductive line 202. Similarly, when the output of IC device 212 transitions from HIGH to LOW, conductive line switches HIGH before interconnect 216 begins to transition, again ensuring a capacitive delay.

However, if the output of memory cell 370 is a logic "1" (HIGH), multiplexer 376 biases conductive line 202 with the output signal from IC device 212, thereby minimizing the capacitive effect from conductive line 202. For example, if the output of IC device 212 is in a logic LOW state for an initial period of time, both conductive line 202 and interconnect 216 will be biased LOW also. Then, when the output of IC device 212 switches to a logic HIGH state, conductive line 202 goes HIGH before interconnect 216 due to the delays introduced by first inverter 372 and second inverter 374. As a result, when interconnect 216 ultimately begins to switch from LOW to HIGH, conductive line 202 is already at a logic HIGH state. Therefore, conductive line 202 produces minimal capacitive delay in the transition of interconnect 216 from a logic LOW to a logic HIGH state. Similarly, when the output of IC device 212 is switching from a logic HIGH state to a logic LOW state, conductive line 202 goes LOW before interconnect 216 begins to change. Therefore, the capacitive delay applied to the transition from HIGH to LOW of interconnect 216 is again minimized.

Figure 4A:
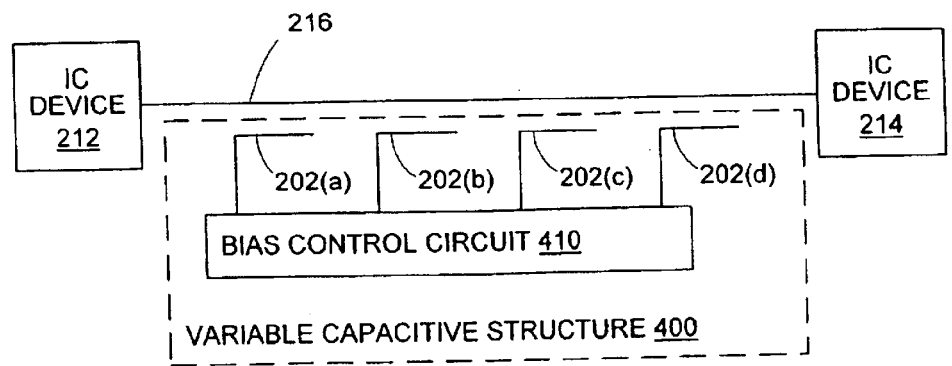
FIGS. 4A–4C are circuit diagrams of adjustable capacitive structures in accordance with the present invention.

FIG. 4A shows a variable capacitance structure 400 in accordance with another embodiment of the present invention. Variable capacitance structure 400 comprises a bias control circuit 410 connected to conductive lines 202(a), 202(b), 202(c), and 202(d). While four conductive lines are shown in FIG. 4A, any number of conductive lines can be formed depending on design requirements and the desired performance of variable capacitive structure 400. Conductive lines 202(a)–202(d) are positioned in parallel with interconnect 216. Bias control circuit 410 provides independent "on/off switchable" bias control to conductive lines 202(a)–202(d). Alternatively, separate bias control circuits could be provided for each of conductive lines 202(a)–202(d). In either case, independent "on/off switchable" bias control allows the total number of conductive lines 202(a)–202(d) providing a capacitive function at any given time to be controlled. Therefore, the total capacitance provided by variable capacitive structure 400 can be adjusted.

Multiple capacitive elements are feasible due to the low manufacturing cost and simple construction of capacitive structure 400. Conductive lines 202(a)–202(d) can be formed during the same manufacturing process steps used to produce interconnect 216. No deep etches or extra polysilicon deposition steps are required.

The quantity, configuration, and distribution of conductive lines in variable capacitive structure 400 define the character of the adjustment capability of variable capacitive structure 400. The sum of the capacitances provided by all of the conductive lines biased "on" by bias control circuit 410 defines the total capacitance coupled to interconnect 216 by variable capacitive structure 400. For example, if conductive lines 202(a)–202(d) have lengths L(a)–L(d), respectively, and all are a constant height h and a equal distance d from interconnect 216, then equation (3), which defines the capacitance provided by a given conductive line, reduces to:

$$C202(x) = C*L(x); \; x = a, b, c, \text{ or } d \tag{4}$$

where C is a constant equal to $((8.85 \times 10^{-2})*k*h)/s$, s is the separation between the interconnect and the conductive lines, and k is the dielectric constant of the dielectric material isolating the interconnect from the conductive lines. If lengths L(a)–L(d) are all equal to a length 2L, then four different non-zero capacitance values are available from variable capacitive structure 400, as shown in Table 1.

TABLE 1

Equal length conductive lines

| L(a) = 2L | L(b) = 2L | L(c) = 2L | L(d) = 2L | Total Capacitance |
|---|---|---|---|---|
|   |   |   |   | 0 |
| X |   |   |   | 2 CL |
| X | X |   |   | 4 CL |
| X | X | X |   | 6 CL |
| X | X | X | X | 8 CL |

("X" indicates an active (biased) conductive line)

As can be seen from the "Total Capacitance" column of Table 1, the capacitance provided by variable capacitive structure 400 can be changed in increments of 2 CL. Therefore, by shortening conductive lines 202(a)–202(d), the adjustment resolution of variable capacitive structure 400 is increased. On the other hand, increasing the lengths of conductive lines 202(a)–202(d) increases the range of capacitance values available from variable capacitive structure 400.

Numerous benefits are provided by this adjustment capability. For example, post-production definition of a precise capacitance value would be possible, thereby minimizing the effects of any manufacturing process variations. The adjustment capability also enables tuning of the capacitive value during normal operation of the IC, thereby providing a means for compensating temperature-induced changes in material properties. In addition, variable capacitance structure 400 allows specific capacitance values to be provided as required during IC operation. Such multiple capacitance values can be used, for example, to provide varying breakpoint frequencies in a signal filter.

Figure 4B:
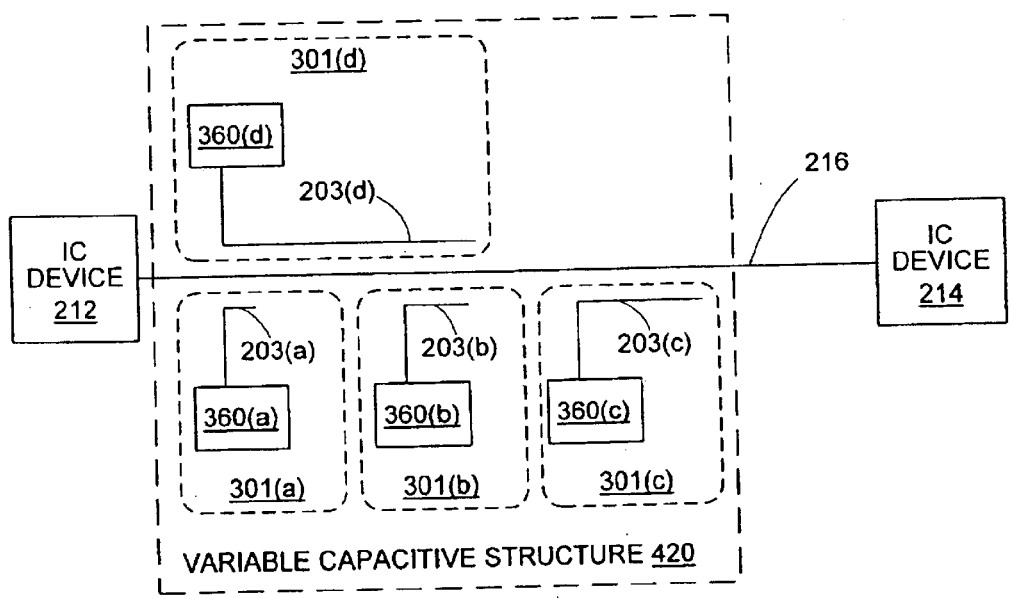

FIG. 4B shows a variable capacitance structure 420 in accordance with another embodiment of the present invention. Variable capacitance structure 420 comprises capacitive structures 301(a), 301(b), 301(c), and 301(d). Capacitive structures 301(a)–301(d) comprise bias control circuits 360(a)–360(d), respectively, coupled to conductive lines 203(a)–203(d), respectively. The use of multiple bias control circuits 360(a)–360(d), rather than the single bias control circuit 410 shown in FIG. 4A, allows different implementations of bias control circuits to be used to bias different conductive lines if desired. Conductive lines 203(a)–203(d) are all parallel to interconnect 216 and are all the same distance from interconnect 216.

Conductive lines 203(a)–203(d) have lengths L1(a)–L'(d), respectively. These lengths L'(a)–L'(d) are all different. Because each of conductive lines 203(a)–203(d) has a different length, the capacitive effect each can produce is different. This difference of length allows a greater variety of total capacitances to be produced by variable capacitive structure 420, as compared to the capacitances that would be achievable with the same number of conductive lines of identical length. Table 1 indicates that the four equal-length conductive lines of variable capacitive structure 400 shown in FIG. 4A can couple four different non-zero capacitance values to interconnect 216. However, if lengths L'(a), L'(b), L'(c), and L'(d) are equal to lengths L, 2L, 4L, and 8L, respectively, then fifteen different non-zero capacitance values can be provided by variable capacitive structure 420, as shown in Table 2. This increase in available capacitance values is achieved without increasing the number of conductive lines requiring bias control.

TABLE 2

| Variable length conductive lines | | | | |
|---|---|---|---|---|
| L'(a) = L | L'(b) = 2 L | L'(c) = 4 L | L'(d) = 8 L | Total Capacitance |
|   |   |   |   | 0 |
| X |   |   |   | CL |
|   | X |   |   | 2 CL |
| X | X |   |   | 3 CL |
|   |   | X |   | 4 CL |
| X |   | X |   | 5 CL |
|   | X | X |   | 6 CL |
| X | X | X |   | 7 CL |
|   |   |   | X | 8 CL |
| X |   |   | X | 9 CL |
|   | X |   | X | 10 CL |
| X | X |   | X | 11 CL |
|   |   | X | X | 12 CL |
| X |   | X | X | 13 CL |
|   | X | X | X | 14 CL |
| X | X | X | X | 15 CL |

("X" indicates an active (biased) conductive line)

Alternatively, instead of varying the lengths of conductive lines 203(a)–203(d), different capacitive effects from each conductive line can be produced by varying the distance or angle between interconnect 216 and each conductive line.

Also in FIG. 4B, conductive line 203(d) is shown on the side of interconnect 216 opposite to conductive lines 203(a)–203(c). This placement allows a greater number of conductive lines to be placed along a given length of interconnect 216. However, the capacitive effect of conductive line 203(d) is the same as the effect it would produce if it were on the same side of interconnect 216 as conductive lines 203(a)–203(c). Conductive lines can be positioned at any location around or over or below interconnect 216, although the conductive lines would ideally be in the same plane to simplify the manufacturing process.

Figure 4C:
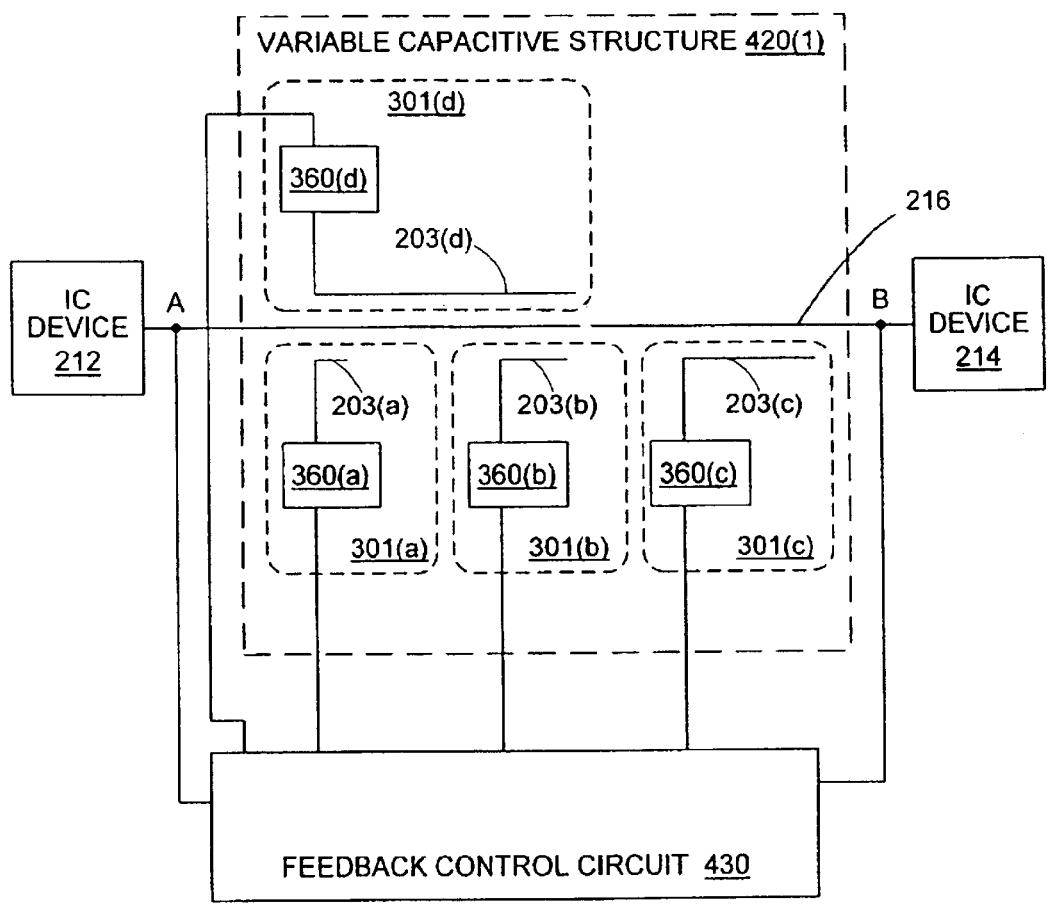

FIG. 4C shows a feedback control circuit 430 coupled to variable capacitance structure 420(1). The structure and operation of variable capacitance structure 420(1) are similar to those of variable capacitance structure 420 shown in FIG. 4B (discussed above). Therefore, the following discussion is specifically directed towards the structure and operation of feedback control circuit 430.

A first input terminal of feedback control circuit 430 is connected to interconnect 216 at a node A, located at the output terminal of IC device 212. A second input terminal of feedback control circuit 430 is connected to interconnect 216 at a node B, located at the input terminal of IC device 214. In addition, bias control circuits 360(*a*)–360(*d*) each include a control terminal coupled to an output terminal of feedback control circuit 430, enabling feedback control circuit 430 to control the activation (biasing) of conductive lines 203(*a*)–203(*d*). By comparing the timing of signals received at nodes A and B, feedback control circuit 430 can determine an actual (measured) delay introduced by variable capacitance structure 420(1) into signals travelling on interconnect 216. Feedback control circuit 430 can then activate or deactivate combinations of bias control circuits 360(*a*) –360(*d*) until the actual delay is equal to a desired delay.

Although the present invention has been described in connection with several embodiments, it is understood that this invention is not limited to the embodiments disclosed, but is capable of various modifications which would be apparent to one of ordinary skill in the art. For example, materials with varying dielectric constants could be used to isolate different conductive lines from the interconnect in order to produce varying capacitive effects. Thus, the invention is limited only by the following claims.

I claim:

1. In an integrated circuit (IC) comprising a plurality of functional devices, a method for introducing a delay to signals on an interconnect connected to one of the functional devices, the method comprising applying a bias voltage to a first conductive line, wherein the first conductive line is parallel to the interconnect and is sized to couple a first predetermined capacitance to the interconnect, and wherein the first conductive line does not carry signals between any of the plurality of functional devices.

2. The method of claim 1, further comprising applying the bias voltage to a second conductive line, wherein the second conductive line is parallel to the interconnect and is sized to couple a second predetermined capacitance to the interconnect, and wherein the second conductive line does not carry signals between any of the plurality of functional devices.

3. The method of claim 2, wherein the first predetermined capacitance is different from the second predetermined capacitance.

* * * * *